United States Patent
Arndt et al.

(10) Patent No.: US 7,271,425 B2
(45) Date of Patent: Sep. 18, 2007

(54) OPTOELECTRONIC COMPONENT

(75) Inventors: Karlheinz Arndt, Bad Abbach (DE); Georg Bogner, Lappersdorf (DE); Günter Waitl, Regensburg (DE); Matthias Winter, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/535,794

(22) PCT Filed: Nov. 27, 2003

(86) PCT No.: PCT/DE03/03923

§ 371 (c)(1),
(2), (4) Date: May 23, 2005

(87) PCT Pub. No.: WO2004/051757

PCT Pub. Date: Jun. 17, 2004

(65) Prior Publication Data

US 2006/0049477 A1 Mar. 9, 2006

(30) Foreign Application Priority Data

Nov. 29, 2002 (DE) .............................. 102 55 932

(51) Int. Cl.
*H01L 29/22* (2006.01)
(52) U.S. Cl. .................. 257/99; 257/676; 257/E33.066
(58) Field of Classification Search .................. 257/81, 257/82, 98–100, 432–434, 459, 706, E33.056, 257/E33.057, E33.058, E33.059, E33.066, 257/E33.075, 676; 362/310, 311, 364, 365, 362/800; 313/512

See application file for complete search history.

(56) References Cited

U.S. PATENT DOCUMENTS

| 6,376,902 | B1 * | 4/2002 | Arndt .......................... 257/678 |
| 6,392,294 | B1 | 5/2002 | Yamaguchi |
| 6,504,238 | B2 * | 1/2003 | Cheng et al. ............... 257/676 |
| 6,578,998 | B2 * | 6/2003 | Zhang ......................... 362/555 |
| 2002/0036464 | A1 | 3/2002 | Takahashi et al. |
| 2002/0113244 | A1 | 8/2002 | Barnett et al. |
| 2003/0141813 | A1 | 7/2003 | Miyashita |

FOREIGN PATENT DOCUMENTS

JP 55016415 2/1980

(Continued)

*Primary Examiner*—Minhloan Tran
*Assistant Examiner*—Benjamin Tzu-Hung Liu
(74) *Attorney, Agent, or Firm*—Fish & Richardson P.C.

(57) ABSTRACT

The invention relates to an optoelectronic component containing an optoelectronic chip (1) and containing a chip carrier (2) that has a central region (3) on which the chip is fixed and that comprises terminals (41, 42, 43, 44) extending outwardly from the central region of the chip carrier (2) to the outside, wherein the chip and portions of the chip carrier are enveloped by a body (5) and wherein the projection of the body and that of each of the longitudinal axes of the terminals onto the contact plane between the chip and the chip carrier are substantially point-symmetrical with respect to the central point of the chip. The invention further relates to an arrangement comprising said component. The advantage of the symmetrical configuration of the component is that the risk of thermomechanically induced failures of the component is reduced.

18 Claims, 2 Drawing Sheets

FOREIGN PATENT DOCUMENTS

| | | |
|---|---|---|
| JP | 04307975 | 10/1992 |
| JP | 10144965 | 5/1998 |
| JP | 11150295 | 6/1999 |
| JP | 2000216413 | 8/2000 |
| JP | 2001177151 | 6/2001 |
| JP | 2002111067 | 4/2002 |
| WO | WO99/07023 | 2/1999 |

* cited by examiner

OPTOELECTRONIC COMPONENT

CROSS-REFERENCE TO RELATED APPLICATIONS

This application is the National Stage of International Application No. PCT/DE2003/003923, filed Nov. 27, 2003, which claims the benefit of German Patent Applications Serial No. 10255932.5, filed on Nov. 29, 2002 The contents of both applications are hereby incorporated by reference in their entireties.

FIELD OF THE INVENTION

The invention relates to an optoelectronic component comprising an optoelectronic chip, a chip carrier, and a housing.

BACKGROUND OF INVENTION

Components of the aforesaid kind are known, for example, from the document WO 99/07023. In these components, an optoelectronic chip is fixed on a chip carrier. The chip and portions of the chip carrier are surrounded by and embedded in a housing. The housing can be fabricated by injection overmolding. The chip carrier has a region on which the optoelectronic chip is fixed. The chip carrier also has terminals that run from the chip-carrying region outwardly out of the housing. There, the terminals generally form soldering surfaces by means of which the component can be soldered fast to a board.

Components of the aforesaid kind are being used increasingly as preferred light sources, for example in the form of light-emitting diodes, in industry, automotive technology, telecommunications and other areas. Requirements as to the mechanical stress behavior and reliability of the components are also increasing sharply as a result. Mechanical requirements relating to thermomechanical stress behavior are especially high.

The reliability of such a component can be quantified by means of a characteristic number whose unit is parts per million (ppm). This measures how many components out of a million show evidence of failure. Current demand is for failure rates of close to 0 ppm.

The known components of the aforesaid kind have the disadvantage that from the standpoint of reliability, they are unable to attain the desired failure rate. A characteristic weakness is that too often the connection between the optoelectronic chip and the chip carrier becomes damaged or splits apart. This can be caused by the fact that when the component is subjected to thermal stresses, of the kind that can occur for example as the terminals are being soldered to a board, the disparate thermomechanical properties of the materials used come to the fore and cause stress. For example, it is customary to use materials having very different thermal expansion coefficients to fabricate the components. The materials—for example, those of the chip carrier and the housing—also differ with respect to their modulus of elasticity. Because of these differences in the materials, strong mechanical forces arise under thermal stress that can deform the individual constituents of the materials or cause them to slide or shear relative to one another.

SUMMARY OF THE INVENTION

This increases the risk of failure of the component after soldering, the cause of which can frequently be traced to severing of the electrical or mechanical connection between the chip carrier and the chip. Even the slightest warming of the component can lead to an open electrical contact between the chip and the chip carrier.

It is, therefore, an object of the present invention to provide a component of the above-cited kind whose reliability is increased.

This object is achieved by means of a component as set forth in below. Advantageous embodiments of the component can be gathered from the further description.

The invention is based on the fundamental idea of striving for a configuration for the component that is as symmetrical as possible in order to minimize the forces that arise under thermal stress, particularly the forces acting between the optoelectronic chip and the chip carrier. This is attempted in particular by giving the component a point-symmetrical configuration. This makes use of the effect that if a body is configured in a point-symmetrical manner, for each point of the body on which a thermomechanical force acts, there is a mirror-symmetrical point of that same body that is acted upon by an oppositely directed force of equal magnitude. Thus, there exists in the body a point at which all the acting forces substantially cancel each other out. This is the point at which the body is point-symmetrical. The component should therefore preferably be disposed at this symmetry point. The foregoing considerations apply in particular to the body surrounding the component.

Similar thinking was applied to the chip carrier. Here, however, due to the strip-shaped terminals, the initial focus of attention basically has to be the longitudinal center axes of the terminals of the chip carrier. After all, the forces exerted between the chip carrier and the surrounding housing act primarily along the longitudinal center axes of the terminals. It should be noted in this connection, for example, that during soldering the terminals can be exposed to a high temperature that is transmitted to the housing. After soldering, the terminals of the chip carrier cool much more rapidly than the housing, a fact that can be attributed to, inter alia, the better thermal conductivity of the terminals and their thermal contact with conductor paths on a printed circuit board. A temperature differential is therefore created, and leads to shear stress between the terminals and the surrounding body. Shear stress of this kind can be represented by a force that acts along the longitudinal center axes of the terminal concerned. Care should also therefore be taken according to the invention to ensure that not just the housing, but also the longitudinal center axes of the terminals of the chip carrier have the necessary symmetry for the forces to cancel each other out.

An optoelectronic component that contains an optoelectronic chip is specified. Further provided is a chip carrier having a central region on which the chip is fixed. In addition, the chip carrier comprises terminals that extend outwardly from the central region of the chip carrier to the outside. The optoelectronic chip and portions of the chip carrier are enveloped by a body. The arrangement of the chip, the conformation of the body and the conformation of the chip carrier are so selected that the projection of the body and that of each of the longitudinal center axes of the terminals onto a contact plane between the chip and the chip carrier are substantially point-symmetrical with respect to the projection of the central point of the chip.

Said terminals preferably extend from the chip carrier to the outside substantially in one plane.

The contact plane between the chip and the chip carrier can, for example, be constituted by the mounting plane in which the chip is mounted on the chip carrier.

It should be pointed out that for purposes of simplification, the phrase "point-symmetrical with respect to the central point" herein is used synonymously with the phrase "point-symmetrical with respect to the projection of the central point."

The effect of the symmetrical configuration of the component is to cause the thermomechanical forces that occur to cancel each other out, thereby reducing the risk of failure of the component.

In one embodiment of the component, the body can be made of a radioparent material. This has the advantage that light generated in the chip can be coupled out directly through the body.

In another embodiment of the component, the body includes a housing that is provided with a recess. A radioparent envelope is arranged in the recess. The chip is embedded in this envelope. The projection of the envelope onto the plane is advantageously substantially point-symmetrical with respect to the central point of the chip.

This embodiment of the component has the advantage that the radioparent material is used only where it is needed, i.e., in the immediate vicinity of the chip. The rest of the body can be implemented as a housing that need not be radioparent and for which a large number of suitable materials are therefore available; these materials can be selected with a view toward weight, mechanical strength, machinability, thermal expansion and so on.

For the case in which the body is made of two different materials, it is particularly advantageous for both the housing and the envelope to be shaped point-symmetrically with respect to the central point. It is particularly advantageous for the chip to be disposed at the symmetry point of the envelope and the housing. This achieves the effect of greatly reducing mechanical stress on the chip in the event of thermally induced deformation of the envelope in the housing, since the forces acting on the chip as a result of the deformation of the envelope can largely cancel each other out due to the point symmetry of the envelope and the point symmetry of the projection of the envelope onto the contact plane.

Constructing the body out of two constituents results in the creation of a contact surface on the floor of the recess, between the envelope and the housing. Depending on the design of the component, this contact surface can be relatively large, specifically when a large part of the surface of the chip carrier is in contact with the envelope. In this case, contact surfaces between the envelope and the housing are created wherever the floor of the recess is not covered by the chip carrier.

In another embodiment, where the so-called "overmold" technique is used, large portions of the chip carrier are completely embedded in the housing and contact between the envelope and the floor of the recess occurs over almost the entire area of the floor of the recess.

In both cases, it is again advantageous if the projection of the contact surfaces between the envelope and the floor of the recess onto the contact plane is substantially point-symmetrical with respect to the central point of the chip. This makes it possible for the shear forces acting between the floor of the recess and the envelope to cancel each other out as well as possible.

In another embodiment of the component, the chip carrier is configured so that not only the longitudinal center axes of the terminals, but also the entire chip carrier is shaped so that its projection onto the plane is substantially point-symmetrical with respect to the central point of the chip.

This embodiment has the advantage of achieving a still better balance of the acting forces.

In another embodiment of the component, additional terminals are provided that are separate from the chip carrier and that serve to contact the chip from the side opposite the chip carrier. These terminals also are advantageously configured so that their longitudinal center axes or the terminals themselves, viewed in their projection onto the contact plane, are substantially point-symmetrical with respect to the central point of the chip.

In another embodiment of the component, means are provided for anchoring the chip carrier in the body. Such anchoring means can, for example, be barbs formed from the chip carrier, holes formed in the chip carrier, or alternatively, for example, deep stampings formed in the chip carrier. The holes and barbs serve to achieve good penetration of the chip carrier by the body, of the kind that can be obtained, for example, by injection-overmolding the chip carrier with the body. These means of anchoring the chip carrier can be disposed asymmetrically in the sense of the above considerations. That is, the means of anchoring the chip carrier need not have any point symmetry as to position with respect to the central point of the chip.

According to another embodiment, however, it is advantageous to arrange these means of anchoring the chip carrier also substantially point-symmetrically with respect to the central point of the chip in the sense of the above-cited embodiments.

According to another embodiment of the component, the means of anchoring the chip carrier are distributed evenly rather than symmetrically over the chip carrier, to prevent a situation in which half of the chip carrier is well anchored in the body while the other half, for example the opposite half of the chip carrier, slips around in the body. This would, of course, increase the risk of asymmetrical shear forces occurring between the body and the chip carrier.

In another embodiment of the component, it is provided that every terminal comprises a soldering area on the back of the body. One advantage of this measure is that the component can be mounted on a board by surface-mounting. It also has the advantage of putting the symmetry of the chip carrier to good use, since optimum mutual cancellation of the acting thermomechanical forces occurs when the heating of the chip carrier by all the terminals takes place sufficiently simultaneously during assembly.

Yet another arrangement comprising the component is specified in which the soldering areas of the chip carrier are soldered to the conductive areas of a printed circuit board.

The invention is explained in greater detail below with reference to embodiment examples and accompanying figures:

DETAILED DESCRIPTION OF THE PREFERRED EMBODIMENTS

Figure 1:
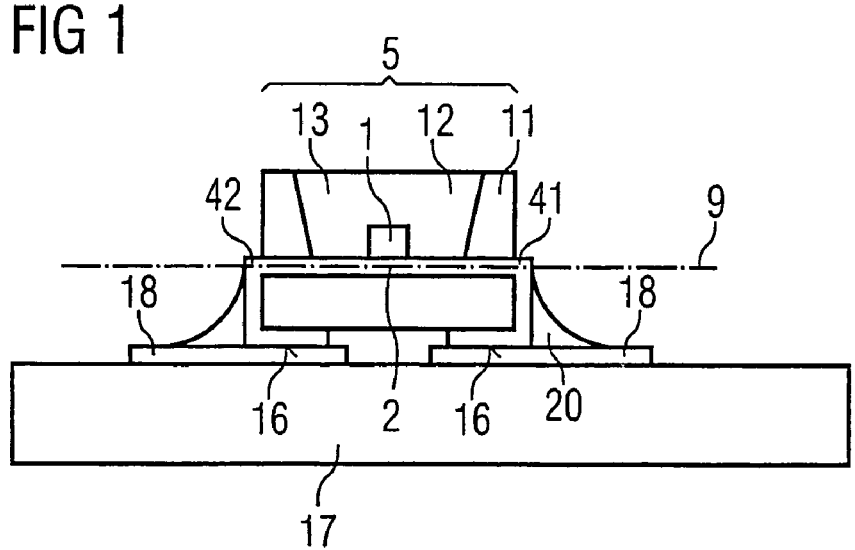
FIG. 1 shows an embodiment example of an inventive component in schematic cross section.

Concerning the figures, it should be noted that like reference numerals denote elements that are the same or at least perform like or similar functions.

FIG. 1 depicts a component comprising an optoelectronic chip 1 that is fixed on a chip carrier 2. Said optoelectronic chip 1 can, for example, be a light-emitting diode, or it can instead be a laser diode. The optoelectronic chip 1 can radiate vertically or laterally. In the latter case, the housing 11 is shaped so that the inner sides of the recess 12 form a reflector for the light radiated by the chip 1.

The chip carrier 2 can be made from a leadframe, for example. This has the advantage of enabling a large run of components to be produced simply and inexpensively. In this case, chip carrier 2 is made from a very thin, conductive metal sheet out of which a specific shape is stamped. For example, an iron/nickel alloy can be considered for use as the material of the chip carrier 2.

Chip 1 and the central portion of chip carrier 2 are enveloped by a body 5 composed of a housing 11 and a radioparent envelope 13. Radioparent envelope 13 is made of a material that is transparent to the radiation emitted by the chip 1. A resin, for example, can be considered for use as the envelope 13.

The housing 11 preferably serves for mechanical stabilization of the component. It can be made of a thermoplast, for example.

With respect to the fabrication of the component according to FIG. 1, it can be provided in a first step to injection-overmold the chip carrier 2 with the housing 11 by the so-called "premold" technique. The second step is to mount the chip 1 and a wire in an opening (cavity) in the housing 11.

In a third step, the envelope 13 is then filled into a recess 12 in the housing.

The embodiment of the component concretely illustrated in FIG. 1 disregards the use of the so-called "overmold" technique. This means that the top side of chip carrier 2 is not covered with material of housing 11 in the area of recess 12. As a result, direct contact between envelope 13 and the floor of housing 11 exists only at those locations on the floor of the housing that are not occupied by chip carrier 2. According to another possible embodiment the "overmold" technique would be used, in which case the top side of chip carrier 2 would also be covered over large areas with material of housing 11. In this case there would be a larger contact area between envelope 13 and the floor of recess 12 (cf. reference numeral 14 in FIGS. 3, 4 and 5).

The components illustrated in the examples cited here are all depicted as components fabricated without the "overmold" technique.

On the back side of housing 11, terminals 41, 42 of chip carrier 2 form solder areas 16, which are soldered to conductive areas 18 of a printed circuit board 17.

It should further be pointed out that the contact area or mounting area between chip 1 and chip carrier 2 and the portions of terminals 41, 42 disposed inside body 5 lie substantially in a single plane 9. This is not mandatory, however, it being conceivable instead to raise or lower the central region (cf. reference numeral 3 in FIGS. 3, 4, 5) relative to the segment of each of terminals 41, 42 that extends inside body 5. In either case, the reference plane with respect to which the criterion of point symmetry is to be met is the contact plane between chip 1 and chip carrier 2.

Terminals 42, 41 are attached to conductive areas 18 of printed circuit board 17 by means of a solder 20.

Figure 2:
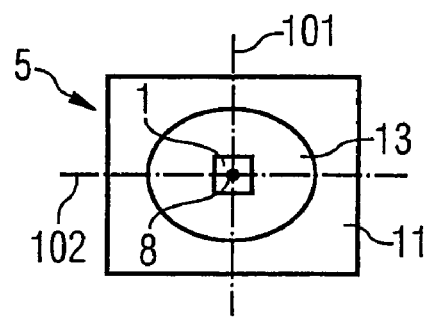
FIG. 2 is a schematic diagram of a projection onto the plane for a housing, a chip and an envelope of one embodiment example of the component.

FIG. 2 shows a projection of the body 5 onto the contact plane between chip 1 and chip carrier 2. It can be recognized that in their respective external outlines in plan view, both housing 11 and radioparent envelope 13 are point-symmetrical with respect to the central point 8 of chip 1. The same is true of the projections of body 5 and envelope 13 onto the contact plane between chip 1 and chip carrier 2. In addition, the elements housing 11 and envelope 13 fulfill still further symmetry conditions, particularly from the standpoint of their projections onto the contact plane between chip 1 and chip carrier 2. Specifically, they are symmetrical with respect to the two axes 101, 102, which are mutually perpendicular. This further increases the symmetry of housing 11 and envelope 13, which can further reduce the risk of failure of the component.

Figure 3:
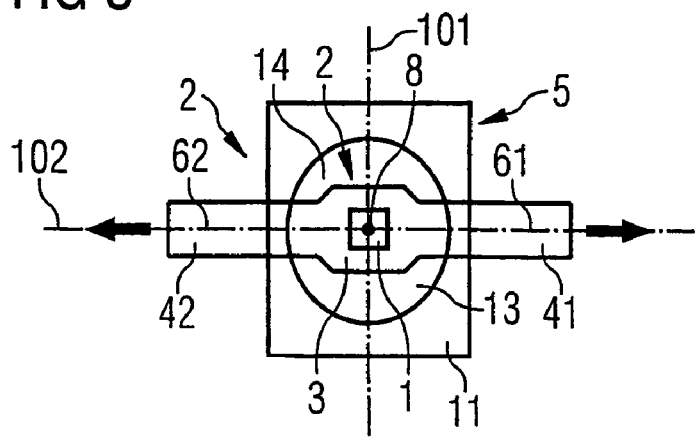
FIG. 3 is a schematic diagram of a projection of the chip carrier onto the plane for one embodiment example of the component.

FIG. 3 shows a projection of chip carrier 2 onto the contact plane between chip 1 and chip carrier 2. It should be pointed out in this case that terminals 41, 42 have not yet been bent downward at the edge of the housing 11 and inward on the bottom of the housing 11, as depicted in FIG. 1. Instead, terminals 41, 42 are run out of the housing 11 in a straight line. It can be gathered from FIG. 3 that the longitudinal center axes 61, 62 of terminals 41, 42 are point-symmetrical with respect to the central point 8 of chip 1. Moreover, chip carrier 2 as a whole is configured point-symmetrically with respect to central point 8. It can also be gathered from FIG. 3 that the chip carrier has a central region 3 on which the chip 1 is fixed. Chip carrier 2 also comprises terminals 41, 42 that serve to electrically contact chip 1 and that extend outwardly from central region 3 to the outside substantially in one plane.

It can additionally be gathered from FIG. 3 that chip carrier 2 has still further symmetries. It is, in particular, symmetrical with respect to the two mutually perpendicular axes 101, 102, said axes 101, 102 being the same axes 101, 102 with respect to which housing 11 and envelope 13 are symmetrical.

Further illustrated in FIG. 3, by two thick black arrows, are the forces acting along terminals 41, 42, which are attributable for example to the heat generated by the soldering of terminals 41, 42. It can be seen that the forces point in opposite directions and are of equal magnitude. These forces therefore cancel each other out, at least at symmetry point 8.

Also to be gathered from FIG. 3 is the shape of the contact surfaces 14 between envelope 13 and the floor of recess 12. Due to the symmetrical configuration of envelope 13 and housing 11 and that of chip carrier 2, and due to the fact that the "overmold" technique is not used in the embodiment example shown here, the symmetry property automatically accrues to contact surfaces 14, since they are in a form that is complementary to the surface of chip carrier 2, while the surface of chip carrier 2 and the surfaces of contact surfaces 14 all together yield the surface of the floor of recess 12, which, again, has the required symmetry in and of itself.

In the case of the "overmold" technique, where due to the partial covering of chip carrier 2 with the material of housing 11 no automatic symmetry is established for contact surfaces 14, the symmetry must be obtained by appropriate measures.

Figure 4:
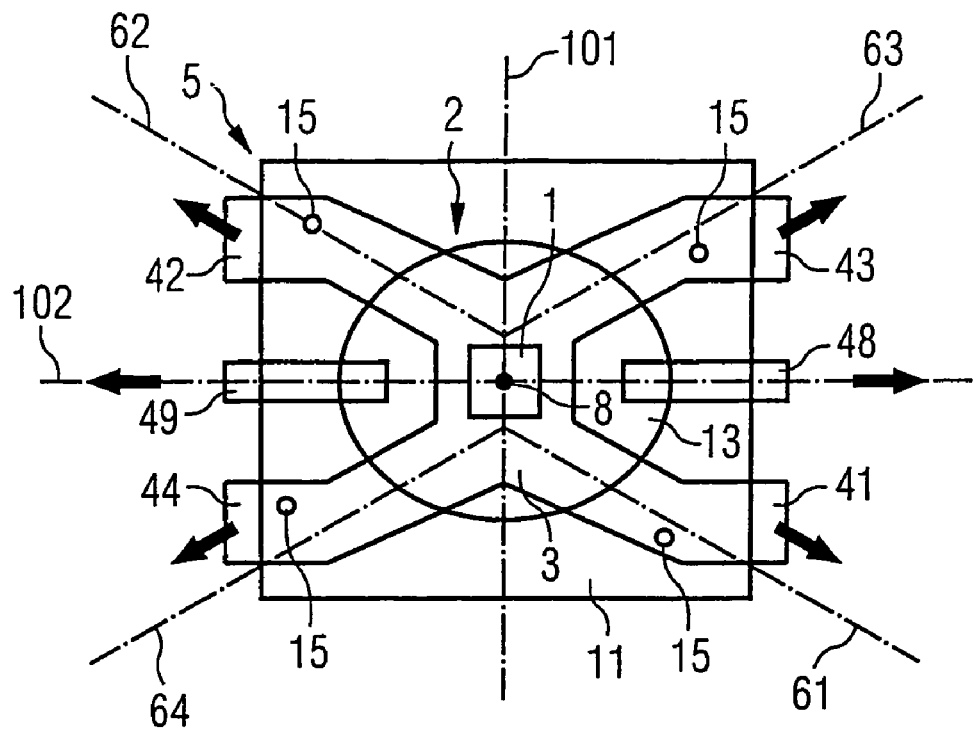
FIG. 4 is a schematic diagram of a projection of a chip carrier onto the plane for a further embodiment example.

FIG. 4 shows a further embodiment example for the configuration of chip carrier 2. Chip carrier 2 is shaped in a manner reminiscent of a St. Andrew's cross. Here again, all the symmetry conditions of FIG. 3 are met. Chip carrier 2 is both point-symmetrical with respect to central point 8 and line-symmetrical with respect to axes 101, 102. In contradistinction to FIG. 3, here chip carrier 2 has, instead two terminals 41, 42, four terminals 41, 42, 43, 44. The paths of longitudinal center axes 61, 62, 63, 64 are also represented.

FIG. 4 also shows the respective positions of anchoring means 15, which serve to anchor chip carrier 2 in body 5. It can be gathered from FIG. 4 that anchoring means 15 are indeed evenly distributed, in some degree, over chip carrier 2; in particular, care has been taken to ensure that none of the quadrants formed by the two mutually perpendicular axes of symmetry 101, 102 is without an anchoring means 15. However, it can also be gathered from FIG. 4 that the respective positions of anchoring means 15 do not possess the symmetry of the other components shown here. Nor is this necessary in order to achieve the inventive purpose, and the anchoring means 15 can therefore be arranged with a view toward other requirements that may be present, without concern for a specific symmetry.

It can further be gathered from FIG. 4 that additional terminals 48, 49 are provided, which form the opposite pole needed by chip carrier 2 for contacting chip 1. Here again, terminals 48, 49 are implemented both as point-symmetrical with respect to central point 8 and line-symmetrical with respect to axes 101, 102. Arranging terminals 41, 42, 43, 44, 48, 49 so that they have twofold axial symmetry in addition to point symmetry has the effect that the tensile forces acting between chip carrier 2 and body 5 and between terminals 48, 49 and body 5, which again in FIG. 4 are represented as thick black arrows, cancel each other out with respect to both translation and torque.

This means that when stress is present, the location of chip 1 is largely free of both translational forces and torques.

It should also be pointed out that terminals 41, 42, 43 44 of the chip carrier can also extend to the outside in such a way that they leave the body roughly parallel to axis of symmetry 101.

Terminals 41, 42, 43, 44 then pass to the outside on sides of body 5 on which terminals 48, 49 are not present.

Figure 5:
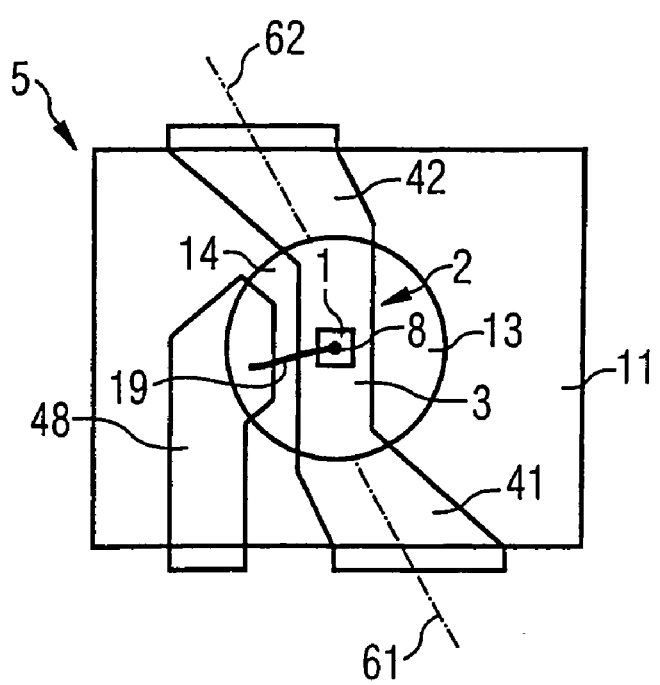
FIG. 5 is a further schematic diagram of a projection of an exemplary chip carrier onto the plane.

FIG. 5, by contrast, illustrates a further exemplary configuration of chip carrier 2 in which chip carrier 2 does not possess twofold axial symmetry. Instead, it is provided according to FIG. 5 that chip carrier 2, i.e. a central region 3 plus terminals 41, 42, exhibits only point symmetry with respect to central point 8. Correspondingly, although the tensile forces acting along longitudinal center axes 61, 62 here are able to cancel each other out, it would be conceivable for a torque to act on chip 1, for example should body 5 become thermally softened. This is not harmful up to a certain point, however, and chip carriers that do not have twofold axial symmetry as illustrated in FIGS. 3 and 4 thus are also completely allowable in the context of this invention.

It can also be gathered from FIG. 5 that it is possible to provide an additional terminal 48, for contacting the top side of chip 1, that does not fulfill the recited symmetry conditions. This, too, is not necessary for achieving the inventive purpose, and FIG. 5 therefore represents a fully viable embodiment example of the present invention.

The bonding wire 19 that connects terminal 48 to the side of chip 1 opposite chip carrier 2 should also be noted.

The protective scope of the invention is not limited by the description of the invention on the basis of the embodiment examples. Rather, the invention encompasses every novel feature and every combination of features, including in particular any combination of features recited in the claims, even if that combination is not stated explicitly in the claims.

This patent application claims the priority of German Patent Application DE 102 55 932.5 dated Nov. 29, 2002, whose entire disclosure content is hereby explicitly incorporated into the present specification by reference.

The invention claimed is:

1. An optoelectronic component comprising:
   an optoelectronic chip,
   a chip carrier having a central region and terminals, the terminals are configured to electrically contact said chip, wherein said chip is fixed on said chip carrier, wherein said terminals extend outwardly from said central region of said chip carrier to the outside,
   wherein said chip and portions of said chip carrier are enveloped by a body,
   and wherein the projection of said body and that of each of the longitudinal center axes of said terminals onto a contact plane between said chip and said chip carrier are substantially point-symmetrical with respect to the projection of said central point of said chip so that heat-induced forces substantially cancel each other out at the projection of said central point of said chip.

2. The component as recited in claim 1, wherein said terminals extend outwardly from said chip carrier to the outside substantially in one plane.

3. The component as recited in claim 2, wherein the contact plane between said chip and said chip carrier is constituted by the mounting plane of said chip on said chip carrier.

4. The component as recited in claim 1, wherein the contact plane between said chip and said chip carrier is constituted by the mounting plane of said chip on said chip carrier.

5. The component as recited in claim 1, wherein said body is made of a radioparent material.

6. The component as recited in claim 1,
   wherein said body includes a housing that comprises a recess,
   there being disposed in said recess a radioparent envelope in which said chip is embedded,
   and wherein the projection of said envelope onto the contact plane between said chip and said chip carrier is substantially point-symmetrical with respect to said central point of said chip.

7. The component as recited in claim 6, wherein the projection of the contact surfaces between said envelope and the floor of said recess onto the contact plane between said chip and said chip carrier is substantially point-symmetrical with respect to said central point, of said chip.

8. The component as recited in claim 1, wherein the projection of said chip carrier onto the contact plane between said chip and said chip carrier is substantially point-symmetrical with respect to said central point of said chip.

9. The component as recited-in claim 1, wherein additional terminals are provided that are separate from said chip carrier and whose projection onto the contact plane between said chip and said chip carrier is substantially point-symmetrical with respect to said central point of said chip.

10. The component as recited in claim 1, further including means for anchoring said chip carrier in said body, said means for anchoring are disposed asymmetrically over said chip carrier.

11. The component as recited in claim 10, wherein said means for anchoring said chip carrier in said body are distributed evenly over said chip carrier.

12. The component as recited in claim 1, wherein means for anchoring said chip carrier in said body are provided whose projection onto the contact plane between said chip and said chip carrier is substantially point-symmetrical with respect to said central point of said chip.

13. The component as recited in claim 1, wherein every terminal on the back side of said body comprises a soldering area.

14. An arrangement comprising a component as recited in claim 1, wherein said soldering areas of said chip carrier are soldered to conductive areas of a printed circuit board.

15. The component as recited in claim 1, wherein the terminals are directly mechanically connected to said central region of said chip carrier.

16. The component as recited in claim 1, wherein the terminals extend integrally outwardly from said central region of said chip carrier.

17. The component as recited in claim 1, wherein the chip carrier is a leadframe.

18. The component as recited in claim 1, wherein the chip carrier has a substantially St. Andrew's Cross shape.

* * * * *

UNITED STATES PATENT AND TRADEMARK OFFICE
CERTIFICATE OF CORRECTION

PATENT NO. : 7,271,425 B2  Page 1 of 1
APPLICATION NO. : 10/535794
DATED : September 18, 2007
INVENTOR(S) : Karlheinz Arndt et al.

It is certified that error appears in the above-identified patent and that said Letters Patent is hereby corrected as shown below:

Column 1
Line 8, delete the word "Applications" and insert the word --Application--

Column 2
Line 13, delete the word "in"

Column 4
Line 54, insert the subheading --BRIEF DESCRIPTION OF THE DRAWINGS--
Line 58, delete the subheading "BRIEF DESCRIPTION OF THE DRAWINGS"

Column 8
Line 58, Claim 9, delete the words "recited-in" and insert the words --recited in--

Signed and Sealed this

Twenty-fourth Day of February, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,271,425 B2 | |
| APPLICATION NO. | : 10/535794 | |
| DATED | : September 18, 2007 | |
| INVENTOR(S) | : Karlheinz Arndt et al. | |

It is certified that error appears in the above-identified patent and that said Letters Patent is hereby corrected as shown below:

<u>Column 8</u>
Line 53, replace "central point, of said chip." with -- central point of said chip. --

<u>Column 10</u>
Line 2, replace "arc directly" with -- are directly --

Signed and Sealed this
Fourteenth Day of June, 2011

David J. Kappos
*Director of the United States Patent and Trademark Office*